United States Patent
Yang et al.

(10) Patent No.: US 8,021,974 B2
(45) Date of Patent: Sep. 20, 2011

(54) STRUCTURE AND METHOD FOR BACK END OF THE LINE INTEGRATION

(75) Inventors: Chih-Chao Yang, Glenmont, NY (US); David Vaclav Horak, Essex Junction, VT (US); Takeshi Nogami, Schenectady, NY (US); Shom Ponoth, Clifton Park, NY (US)

(73) Assignee: Internatioanl Business Machines Corporation, Armonk, NY (US)

( * ) Notice: Subject to any disclaimer, the term of this patent is extended or adjusted under 35 U.S.C. 154(b) by 206 days.

(21) Appl. No.: 12/351,436

(22) Filed: Jan. 9, 2009

(65) Prior Publication Data

US 2010/0176512 A1    Jul. 15, 2010

(51) Int. Cl.
H01L 21/02    (2006.01)

(52) U.S. Cl. ........ 438/618; 438/622; 438/639; 438/643; 438/667; 438/781; 257/E21.013; 257/E21.579; 257/E21.586; 257/E21.656; 257/E23.144; 257/E27.088; 257/E29.343

(58) Field of Classification Search .......... 438/618–622, 438/639–643, 667, 781; 257/E21.013–E21.019, 257/579–586, 648–656, 23.144–23.167, 257/27.088, 29.343

See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,130,449 A * | 10/2000 | Matsuoka et al. | 257/296 |
| 6,383,920 B1 | 5/2002 | Wang et al. | |
| 6,429,519 B1 | 8/2002 | Uzoh | |
| 6,436,814 B1 * | 8/2002 | Horak et al. | 438/637 |
| 6,653,737 B2 * | 11/2003 | Horak et al. | 257/762 |
| 6,815,329 B2 * | 11/2004 | Babich et al. | 438/619 |
| 7,084,062 B1 | 8/2006 | Avanzino et al. | |
| 7,122,462 B2 | 10/2006 | Clevenger et al. | |
| 7,132,364 B2 * | 11/2006 | Kim | 438/639 |
| 7,135,403 B2 * | 11/2006 | Park | 438/643 |
| 7,144,761 B2 * | 12/2006 | Nakagwa et al. | 438/118 |
| 7,327,033 B2 | 2/2008 | Edelstein et al. | |
| 7,429,529 B2 * | 9/2008 | Farnworth et al. | 438/667 |
| 7,446,057 B2 * | 11/2008 | Bietsch et al. | 438/781 |
| 7,615,494 B2 * | 11/2009 | Han et al. | 438/707 |
| 2002/0142581 A1 * | 10/2002 | Horak et al. | 438/626 |
| 2006/0286800 A1 | 12/2006 | Dominguez et al. | |
| 2007/0205482 A1 | 9/2007 | Yang et al. | |
| 2008/0020230 A1 | 1/2008 | Edelstein et al. | |

* cited by examiner

*Primary Examiner* — Michael S Lebentritt
(74) *Attorney, Agent, or Firm* — Lisa U. Jaklitsch; Katherine S. Brown

(57) ABSTRACT

An improved semiconductor structure consists of interconnects in an upper interconnect level connected to interconnects in a lower interconnect level through use of a conductive protrusion located at the bottom of a via opening in an upper interconnect level, the conductive protrusion extends upward from bottom of the via opening and into the via opening. The improved interconnect structure with the conductive protrusion between the upper and lower interconnects enhances overall interconnect reliability.

20 Claims, 8 Drawing Sheets

STRUCTURE AND METHOD FOR BACK END OF THE LINE INTEGRATION

BACKGROUND

The invention relates generally to a semiconductor structure and a method of fabrication thereof, and more particularly to integrating an interconnect in an upper interconnect level with an interconnect in a lower interconnect level to provide good electrical and mechanical contact between the upper and lower level interconnects.

Good electrical and mechanical contact between the upper and lower level interconnects is required to insure overall interconnect reliability. With each generation, more devices and circuits are squeezed onto a semiconductor chip. Consequently, the lines and vias formed in the semiconductor chips have become ever thinner. A major problem with the thinning metal lines and vias resides in the integration of thin vias in an upper interconnect level with lines in a lower interconnect level. More specifically, as the vias become thinner, the mechanical integrity of those vias worsens particularly for deep submicron vias embedded in low-k dielectric materials at the contact area with underlying interconnects. Porous low-k dielectric material only exasperates the problem because a bigger thermal coefficient mismatch between the lower-k dielectrics and metal interconnect is expected than with higher-k dielectrics.

U.S. Patent Publication No. 2007/0205482 depicts a prior art structure for integrating interconnects in an upper interconnect level with interconnects in a lower interconnect level in which a "via punch through," also known as a "via gouging" process is used to create a via with improved mechanical and electrical integrity. The via has an anchoring area, also known as a gouged via feature, that achieves reasonable contact resistance as well as increases the mechanical strength of the via. The improved contact resistance and mechanical strength improves integration of the interconnect with interconnects in a lower interconnect level. The reason for the improved integration is that the gouged via increases the contact area of the interconnect with the interconnect in the lower interconnect level.

BRIEF SUMMARY

A first embodiment of the invention is directed a method of fabricating a semiconductor structure. The method includes the step of providing an interconnect structure that includes a lower interconnect level comprising a first dielectric layer having at least one conductive feature embedded therein, an upper interconnect level comprising a second dielectric having at least one via opening that exposes a portion of the at least one conductive feature located atop the lower interconnect level, the lower and upper interconnect levels are partially separated by a dielectric capping layer, and a patterned hard mask on a surface of the upper interconnect level. The method includes the step of forming a first barrier layer on all exposed surfaces of the via opening. The method includes the step of removing the first barrier layer at a bottom of the via opening and on the patterned hard mask while maintaining the first barrier layer on remaining sidewall surfaces of the via opening. The method includes the step of forming a conductive protrusion in the at least one conductive feature, the conductive protrusion located at a bottom of the via opening and extends upward from bottom of the via opening and into the at least one via opening. The method includes the step of forming a seed layer within the at least one via opening. The method includes the step of filling the at least one via opening with a conductive material.

A second embodiment of the invention is directed to a semiconductor structure. The structure includes a lower interconnect level comprising a first dielectric layer having at least one conductive feature embedded therein. The structure includes a dielectric capping layer located on the first dielectric layer and at least a portion of the conductive feature. The structure includes an upper interconnect level comprising a second dielectric having at least one conductively filled via wherein the conductively filled via is in contact with an exposed portion of the at least one conductive feature of the first interconnect level by a conductive protrusion located at a bottom of the via that extends upward from bottom of the via and into the via. The conductively filled via is separated from the second dielectric in the upper interconnect level by a first barrier layer.

BRIEF DESCRIPTION OF THE SEVERAL VIEWS OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION

The invention will now be described with reference to the accompanying figures. In the figures, various aspects of the structures have been depicted and schematically represented in a simplified manner to more clearly describe and illustrate the invention.

By way of overview and introduction, the embodiments of the invention are directed to a semiconductor integration structure and method. More specifically, a conductive feature in a lower interconnect level is connected to a conductive feature in an upper interconnect level by a conductive protrusion that extends from the bottom of a via opening and up into the via opening in an upper interconnect level. The conductive protrusion increases the mechanical strength of the via, and thereby ensures a reliable electrical contact. The conductive protrusion has increased contact area with the underlying interconnect, and therefore the mechanical strength of the via is improved.

The invention will be described with reference to FIG. 1, which depicts an embodiment of the invention and FIGS. 2a-2g, which depict the formation of the embodiment in FIG. 1.

Figure 1:
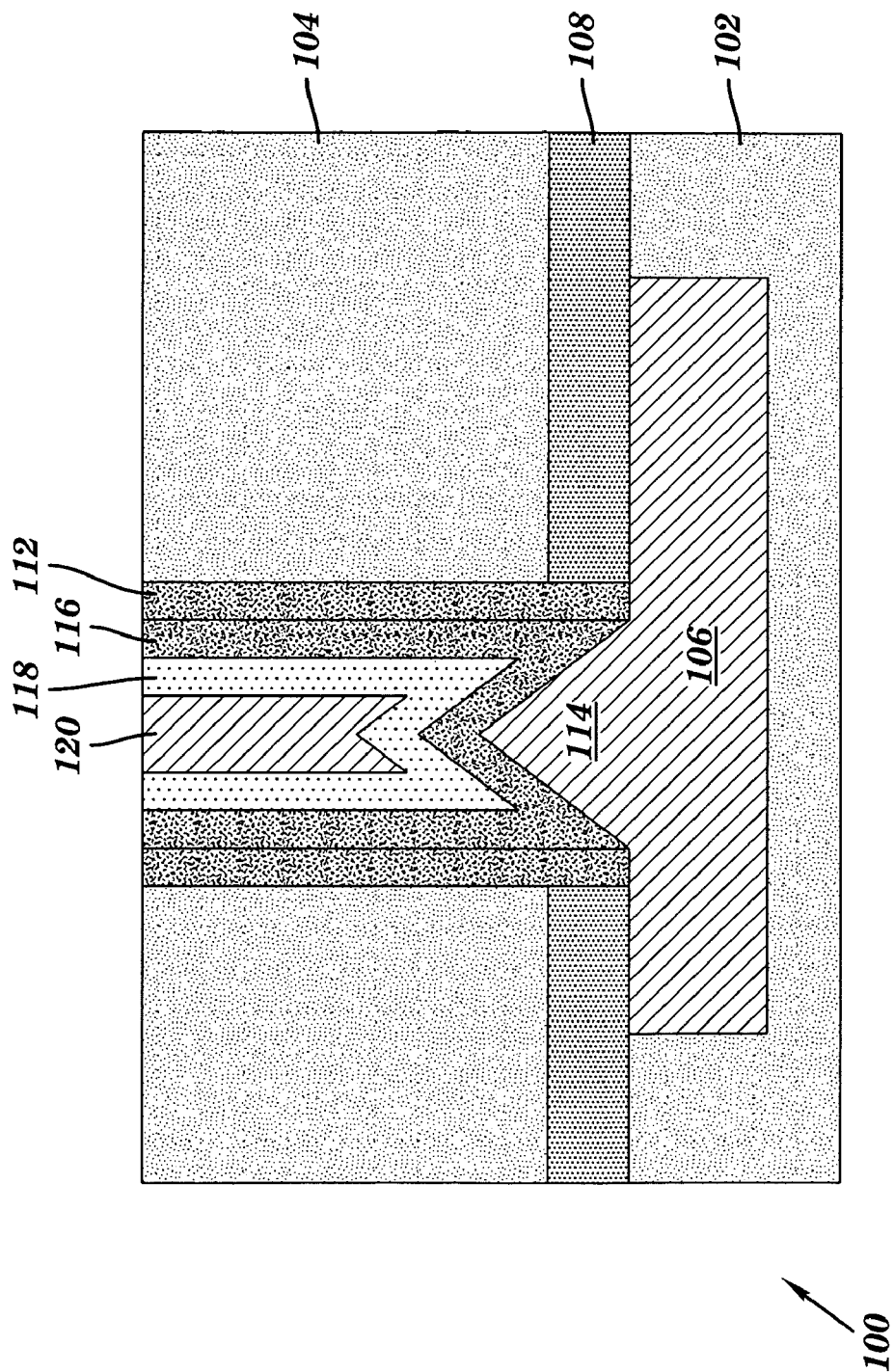
FIG. 1 depicts an embodiment of the invention.

With reference to FIG. 1, there is shown an embodiment of the invention. As depicted, the lower interconnect level includes at least one conductive feature 106 embedded in dielectric layer 102. The conductive feature includes a conductive protrusion 114 that integrates conductive feature 106 in the lower interconnect level with the via in the upper interconnect level. Dielectric capping layer 108 separates the lower and upper interconnect levels. The via depicted in FIG. 1 has two barrier layers 112, 116, however as described herein the second barrier layer 116 is an optional layer in an embodiment of the invention. Finally, the via depicted in FIG. 1 includes a seed layer 118 and conductive material fill 120.

Figure 2A:
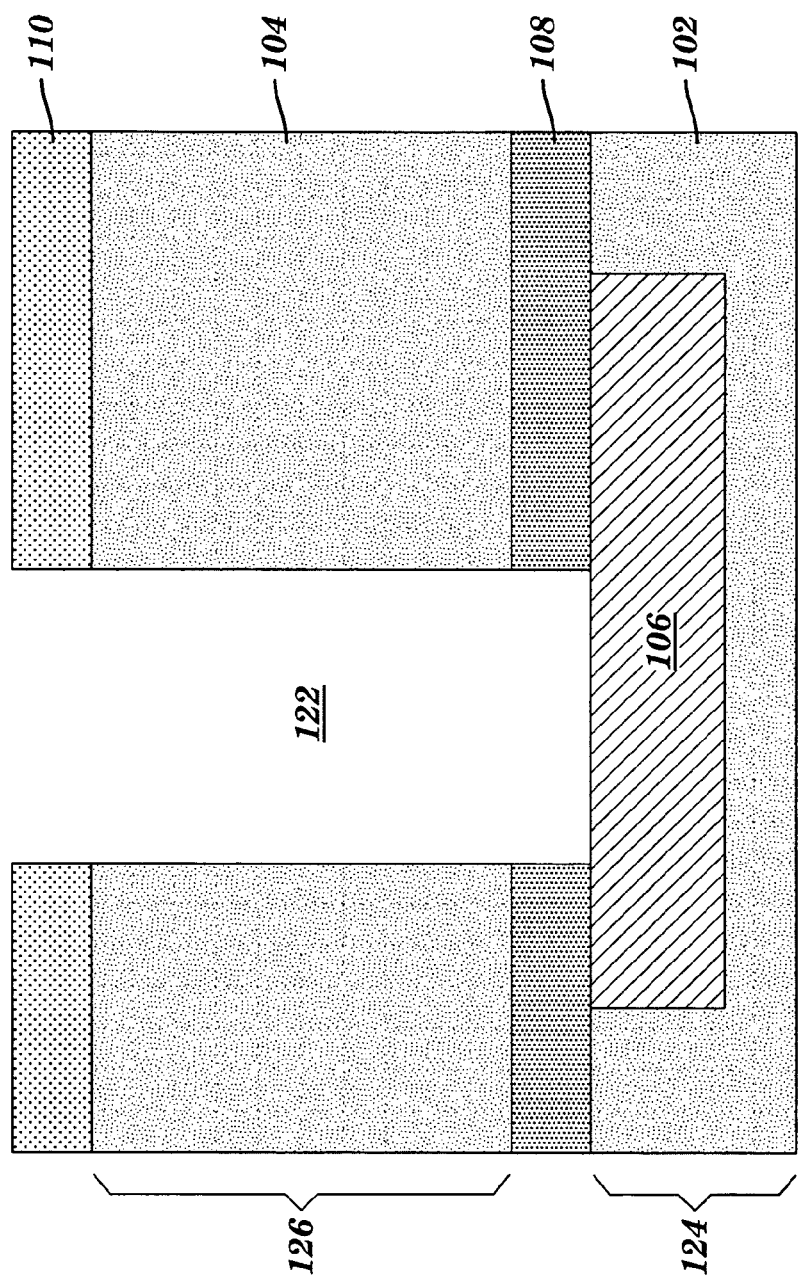
FIGS. 2a-2g depict fabrication steps corresponding to the embodiment of the invention depicted FIG. 1.

FIG. 2a depicts the first step of the method of an embodiment of the invention. More specifically, FIG. 2a depicts a lower interconnect level 124 separated from an upper interconnect level 126 by a dielectric capping layer 108. The dielectric capping layer 108 is preferably made of $Si_3N_4$, SiC, $Si_4NH_3$, $SiO_2$, a carbon doped oxide, a nitrogen and hydrogen doped silicon carbide SiC(N,H), or multilayers formed by any combination of these materials. The purpose of the dielectric capping layer 108 is to act as an etching stop layer for the next level build.

The lower interconnect level 124 of FIG. 2a includes as least one conductive feature 106 embedded in a dielectric layer 102. The conductive feature 106 comprises Cu, Al, Al(Cu), W or alloys of these materials. The dielectric layer 102 is preferably made of any of the following materials $SiO_2$, $Si_3N_4$, SiCOH, SiLK®, dense dielectric material with a dielectric constant of about 2.5 or more, or porous ultra low-k dielectric material with a dielectric constant of 2.5 or less.

The upper interconnect level 126 of FIG. 2a includes a via opening 122 formed in dielectric layer 104 that exposes a portion of a conductive feature 106 in the lower interconnect level 124. The dielectric layer 104 is made of any of the following materials SiO2, Si3N4, SiCOH, SiLK®, dense dielectric material with a dielectric constant of about 2.5 or more, or porous ultra low-k dielectric material with a dielectric constant of 2.5 or less. Note that while a single damascene structure, e.g. single via opening 122, is depicted in FIG. 2a, one skilled in the art would appreciate that the invention is not limited to a single damascene structure but includes dual damascene structures, e.g. a line and via opening, as well. The via opening 122 is formed through the use of a hard mask 110 that has via patterns and transferring those via patterns to dielectric material 104 below the hard mask 110. The hard mask 110 consists of the following types of materials SiO2, Si3N4, SiC, SiC(N), Ta(N), Ti(N), or W(N).

Figure 2B:
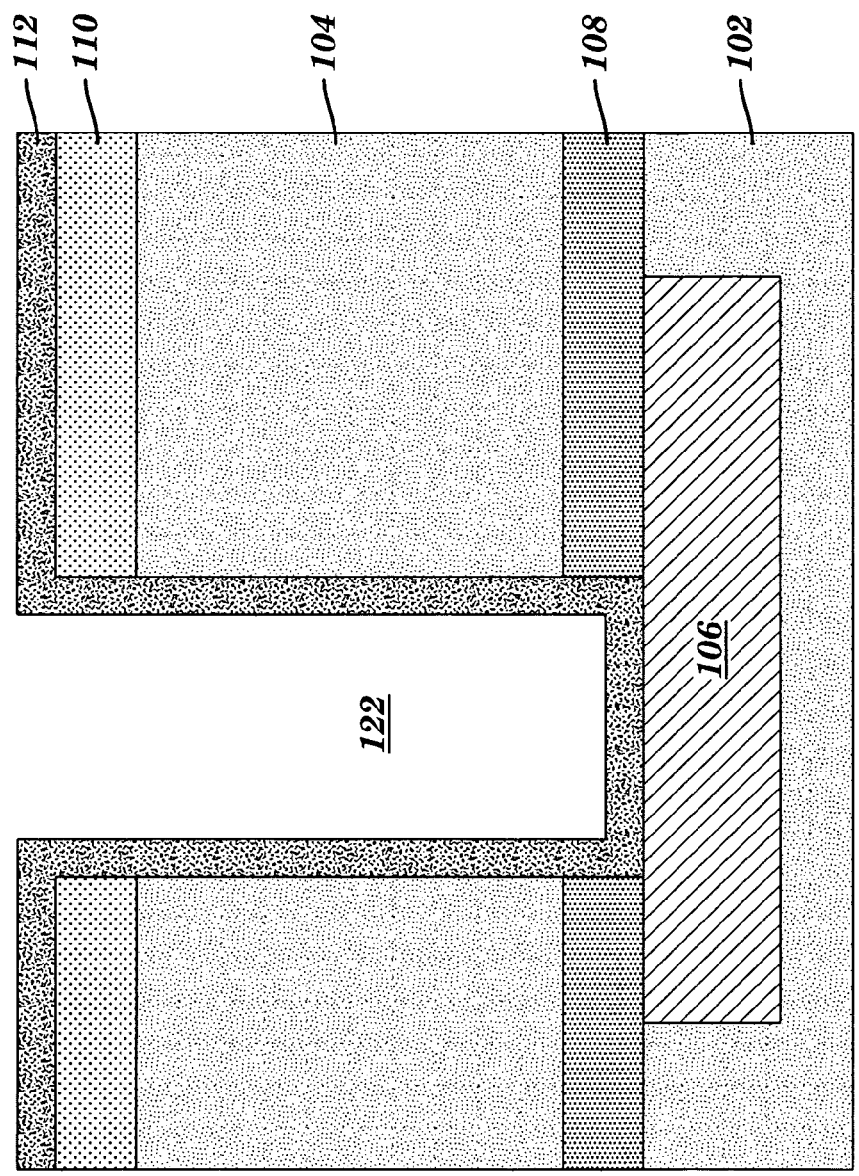

FIG. 2b depicts forming a barrier layer 112 on the exposed portions of the via opening 122 in FIG. 2a. The barrier layer 112 is conformally deposited on all exposed surfaces of the via opening 122. The barrier layer 112 prevents diffusion of conductive material into the surrounding dielectric 104. The barrier layer 112 consists of depositing one of Ta, TaN, Ti, TiN, Ru, RuN, RuTa, RuTaN, W, WN or Co and has a thickness in the range of 10 A to 200 A.

Figure 2C:
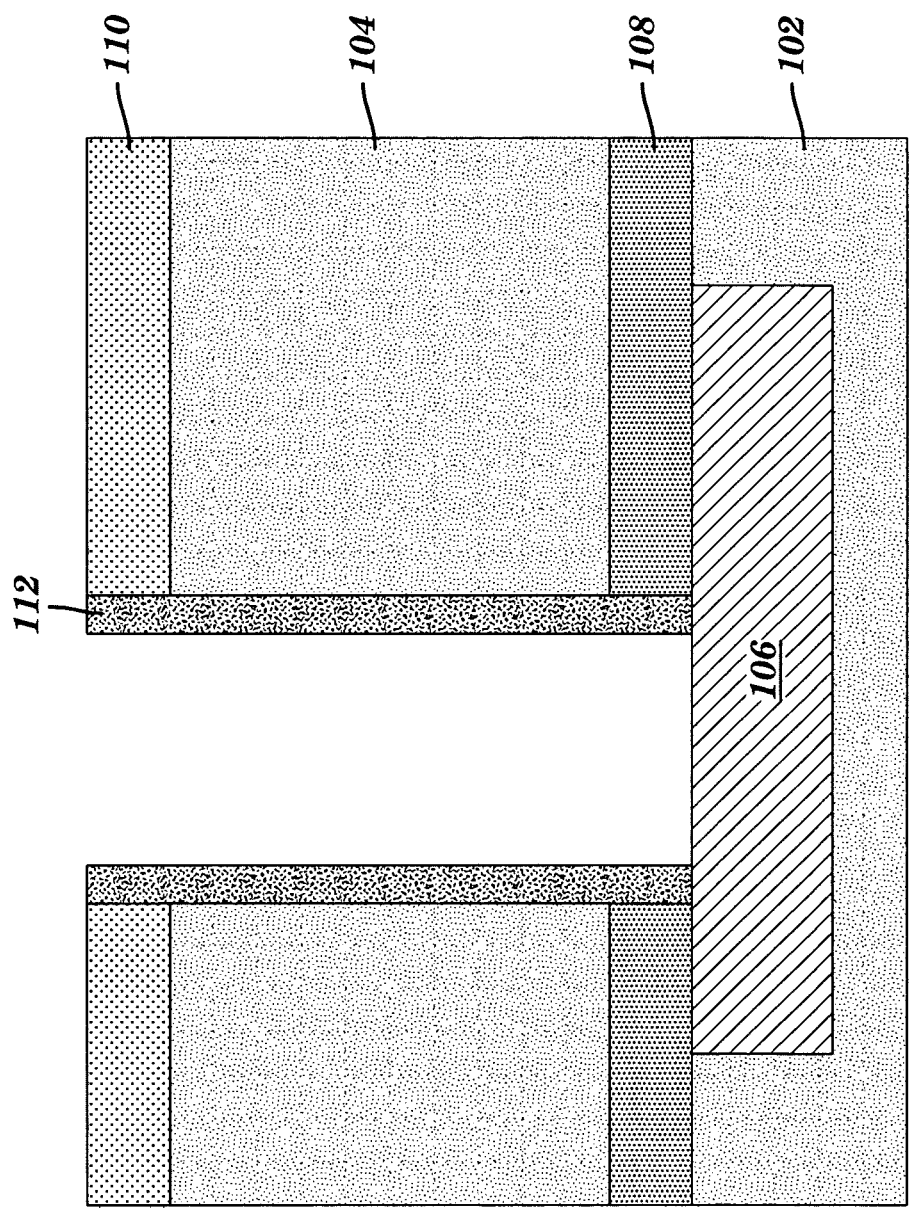

FIG. 2c depicts removal of the deposited barrier layer 112 in FIG. 2b. The barrier layer 112 is removed by a directional gaseous sputtering. Any of the following materials could be used for the gaseous sputtering Ar, He, Ne, Xe, $N_2$, $H_2$, $NH_3$, $N_2H_2$ or mixtures of any of these materials. As shown in FIG. 2c, the directional gaseous sputtering only removes the barrier layer 112 on the bottom of the via opening 122 and on the field area while maintaining the barrier layer 112 on the sides of the via opening 122. The gaseous sputtering further does not remove a significant amount of the conductive fill in the underlying conductive feature 106. That is, a gouged feature is not formed in the underlying interconnect from this sputtering process.

Figure 2D:
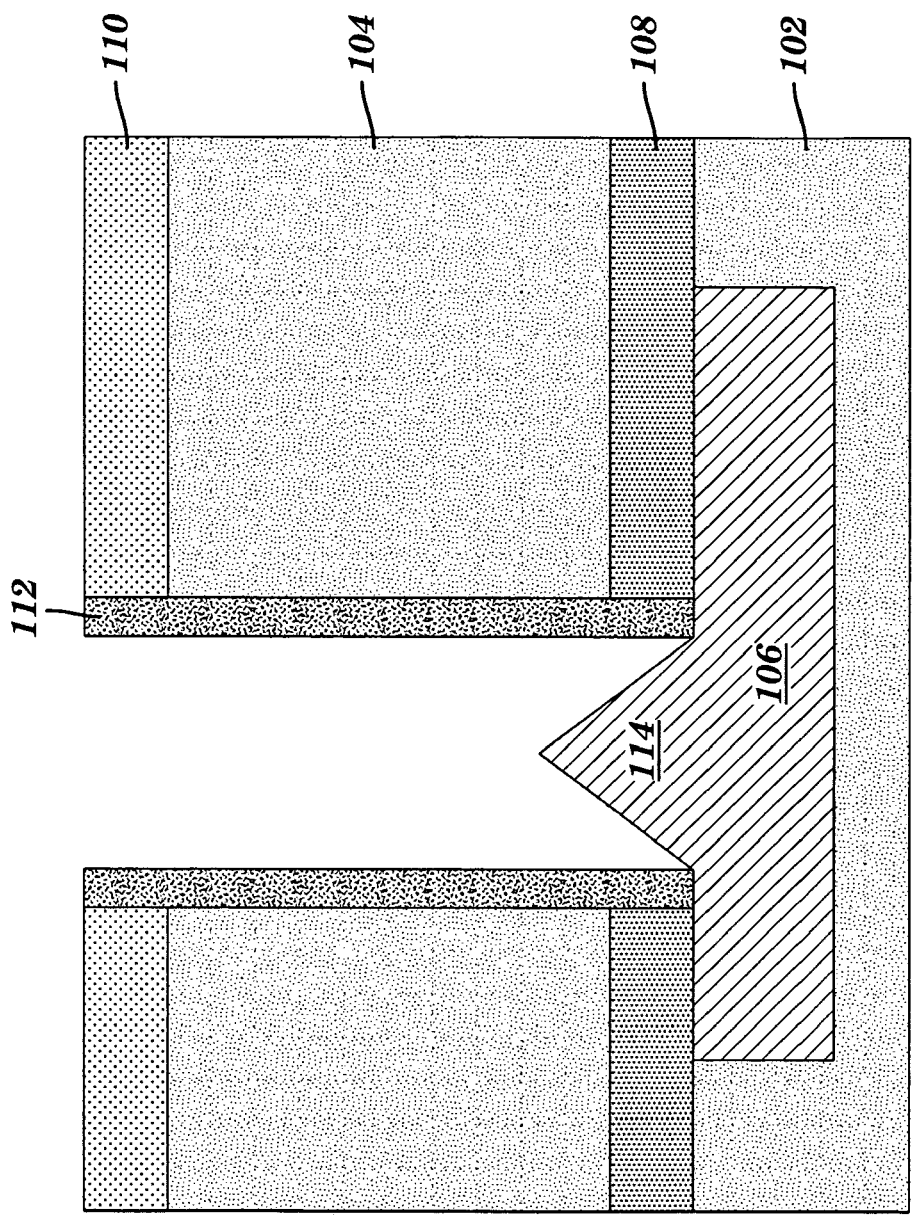

FIG. 2d depicts the formation of a conductive protrusion 114 in the conductive feature 106. The conductive protrusion 114 is placed at the bottom of the via opening 122 and extends upward from the bottom of the via opening 122 and into the via opening 122. The conductive protrusion 114 has a pyramid shape with a height between 5 A and 500 A. The conductive protrusion 114 is formed by PVD, CVD, ALD, electro plating, electroless plating, or combinations of any of these techniques. The conductive protrusion 114 is preferably made of Cu, Ru Ir, Co, Rh, Ta, W, Ti, Pt or alloys made of any of these materials. Either a directional PVD deposition or selective deposition from CVD, ALD, electro plating, electroless plating can create the conductive protrusion 114 at bottom of the via as shown in FIG. 2d. For selective deposition from CVD, ALD, electro plating and electroless plating methods, the conductive protrusion material initially nucleates at the via bottom and on the underlying interconnect surface, and then grows/extends upward.

Figure 2E:
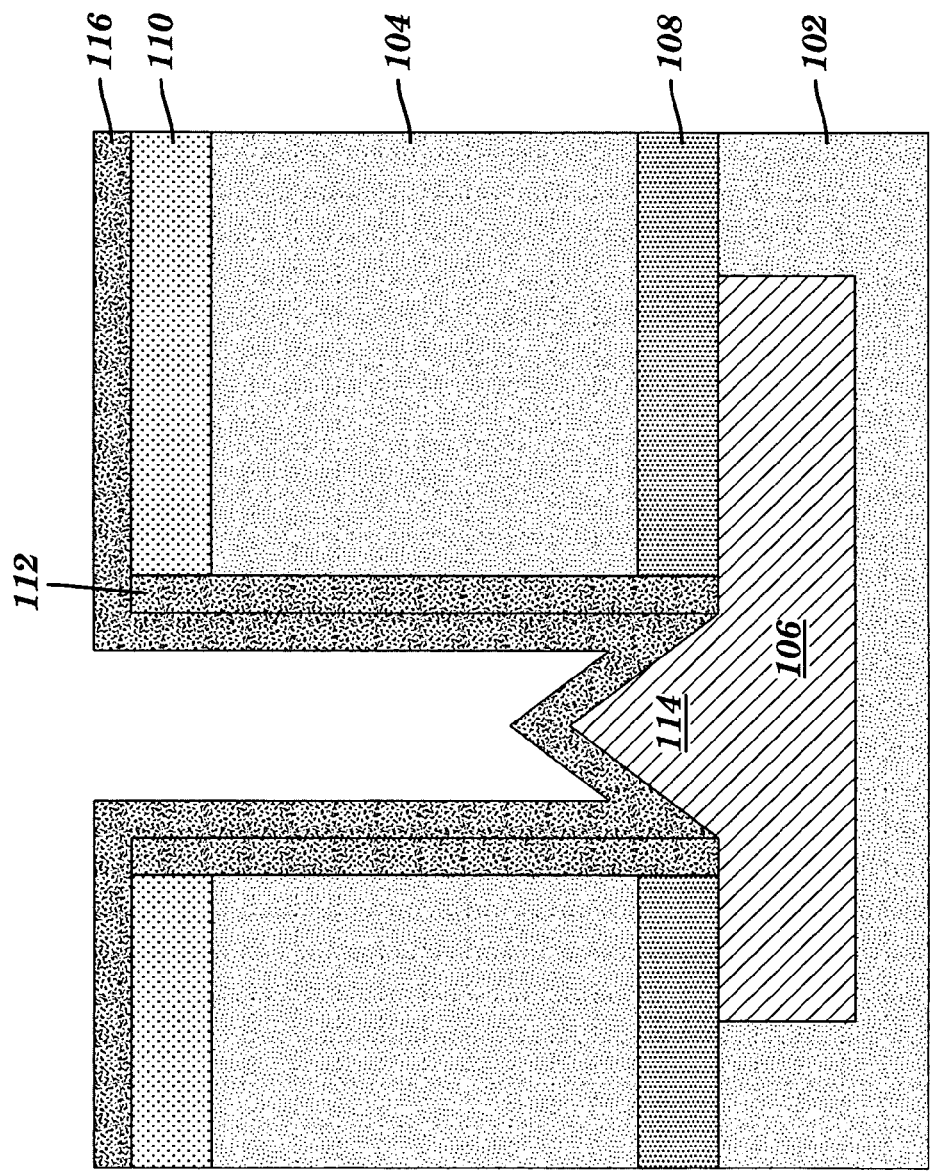

FIG. 2e depicts an optional additional step in the formation of an embodiment of the invention. More specifically, FIG. 2e depicts forming a second barrier layer 116 over the first barrier layer 112 that exists on the sides of the via opening 122, and over the conductive protrusion 114 formed in FIG. 2d. The second barrier layer 116 has a thickness in the range of between 20 A and 200 A. Similar to the first barrier layer 112, the second barrier layer 116 consists of depositing one of the following materials Ta, TaN, Ti, TiN, Ru, RuN, RuTa, RuTaN, W, WN or Co on top of the first barrier layer 112 that exists on the sides of the via opening 122 and the conductive protrusion 114. While the second barrier layer 116 could be formed over the sides of the via opening 122 and conductive protrusion 114, the second barrier layer 116 is not a required element of the invention. The purpose of the second barrier layer 116 is to behave as a diffusion barrier or an adhesion layer.

Figure 2F:
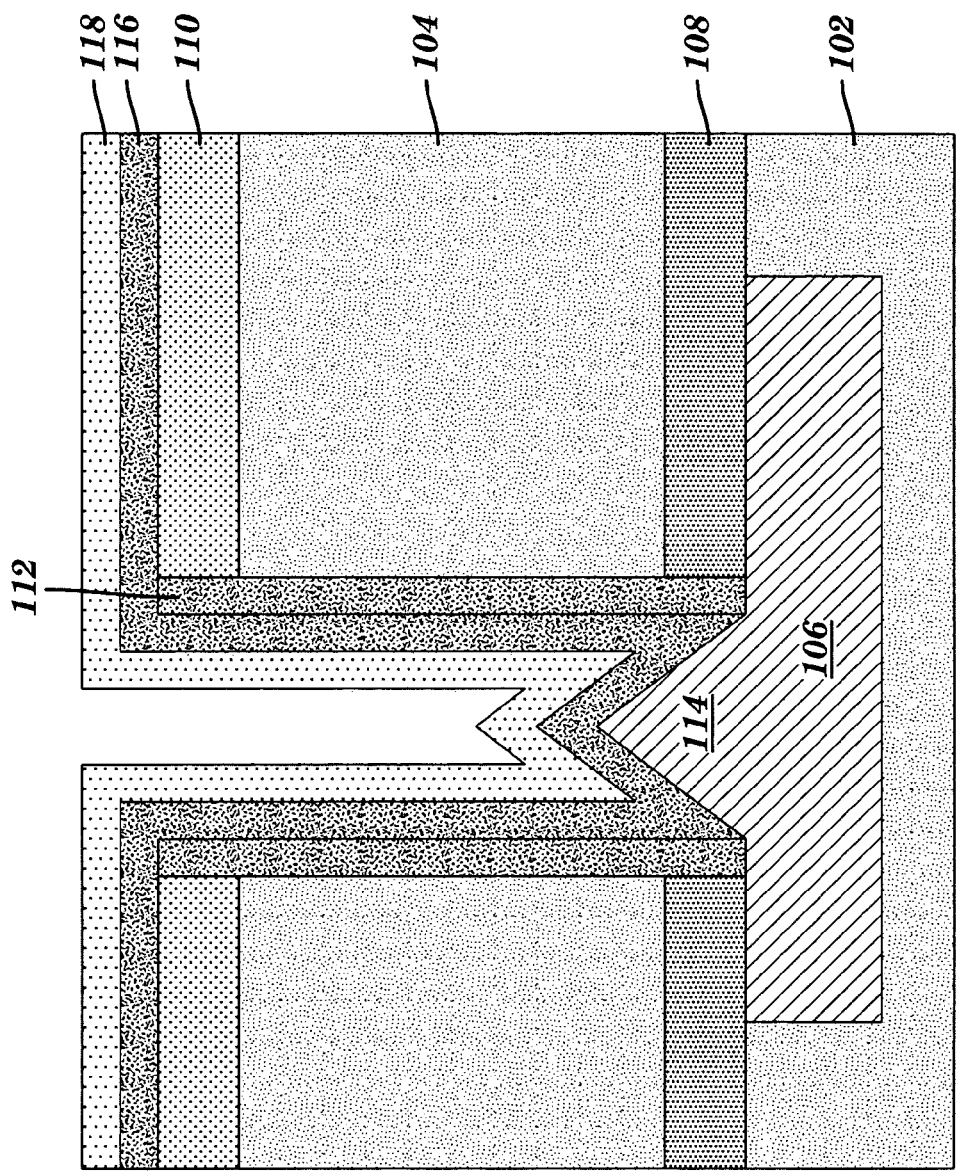

FIG. 2f depicts the forming an adhesion/plating seed layer 118 either over a second barrier layer 116, if the optional second barrier layer 116 of FIG. 2e is formed, or over the first barrier layer 112 that exists on the sides of the via opening 122 and the conductive protrusion 114, if the optional second barrier layer 116 of FIG. 2e is not formed. The adhesion/plating seed layer 118 is formed by depositing one or combination of Ru, TaRu, Ir, Rh, Pt, Pd, Cu, Co or alloys of any of these materials. The adhesion/plating seed layer 118 has a thickness in a range of 20 A to 800 A.

Figure 2G:
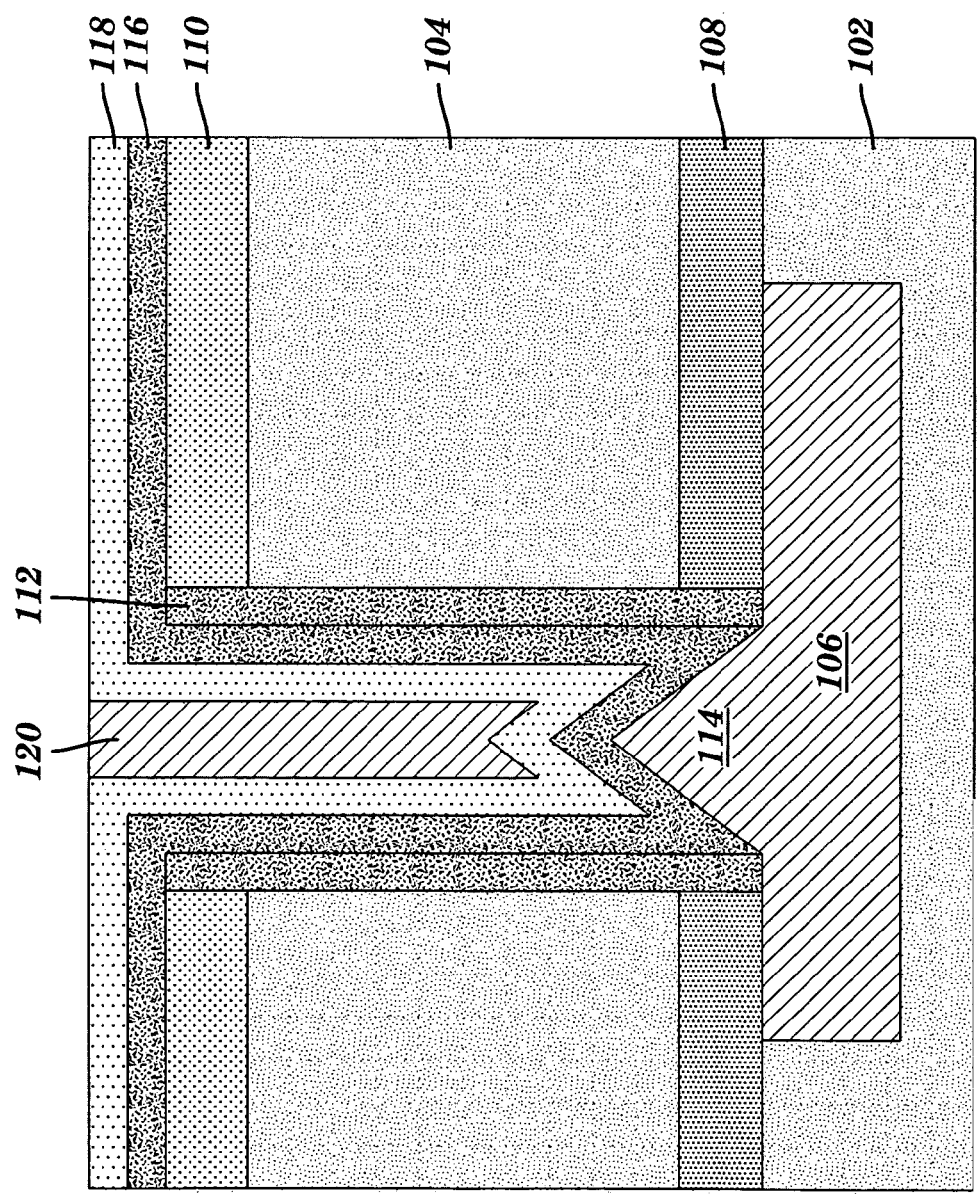

FIG. 2g depicts filling the via opening 122 with a conductive material 120 after formation of the adhesion/plating seed layer in FIG. 2f. The via opening 122 is filled by depositing Cu, Al, W or alloys of any of these materials.

As mentioned above, FIG. 1 depicts an embodiment of the invention. Once the via opening 122 has been filled with conductive material 120 as depicted in FIG. 2g, the semiconductor structure is planarized. As shown in FIG. 1, after planarization, the conductive filled via has an upper surface coplanar with the upper surface of the second dielectric material 104. FIG. 1 depicts the embodiment of the invention that includes the second barrier layer 116. As discussed herein, the second barrier layer is an optional layer in an embodiment of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of fabricating a semiconductor structure comprising:
   providing an interconnect structure that includes a lower interconnect level comprising a first dielectric layer having at least one conductive feature embedded therein, an upper interconnect level comprising a second dielectric having at least one via opening that exposes a portion of said at least one conductive feature located atop said lower interconnect level, said lower and upper interconnect levels are partially separated by a dielectric capping layer, and a patterned hard mask on a surface of said upper interconnect level;
   forming a first barrier layer on all exposed surfaces of said via opening;
   removing said first barrier layer at a bottom of said via opening and on said patterned hard mask while maintaining said first barrier layer on remaining sidewall surfaces of said via opening;
   forming a conductive protrusion in said at least one conductive feature, said conductive protrusion located at a bottom of said via opening and extends upward from bottom of said via opening and into said at least one via opening;
   forming a seed layer within said at least one via opening, and;
   filling said at least one via opening with a conductive material.

2. The method as in claim 1, wherein said providing said interconnect structure includes forming at least one conductive feature within said first dielectric material, forming a blanket dielectric capping layer on said first dielectric material, forming said second dielectric material on said blanket dielectric capping layer, forming a patterned hard mask having via patterns on said second dielectric material, and transferring said via patterns into said second dielectric material and said blanket dielectric capping layer.

3. The method as in claim 1, further comprising:
   a forming a barrier layer step after said forming a conductive protrusion step and before said forming a seed layer step, said forming a barrier layer step comprising forming a second barrier layer on said first barrier layer and atop said conductive protrusion.

4. The method as in claim 1, further comprises forming said first barrier layer with a material selected from a group consisting of Ta, TaN, Ti, TiN, Ru, RuN, RuTa, RuTaN, W, WN and Co.

5. The method as in claim 3, further comprises forming said second barrier layer with a material selected from a group consisting of Ta, TaN, Ti, TiN, Ru, RuN, RuTa, RuTaN, W, WN and Co.

6. The method as in claim 1, wherein said removing of said first barrier layer comprises sputtering directional gas selected from a group consisting of Ar, He, Ne, Xe, $N_2$, $H_2$, $NH_3$, $N_2H_2$ and mixtures thereof.

7. The method as in claim 1, further comprises forming said conductive protrusion with PVD, CVD, ALD, electro plating, electroless plating, or combinations thereof.

8. The method as in claim 1, further comprising said forming of said seed layer comprises depositing one or a combination of Ru, TaRu, Ir, Rh, Pt, Pd, Cu, Co or alloys thereof.

9. The method as in claim 1, further comprising said filling said at least one via opening comprises depositing at least one of Cu, Al, W or alloys thereof.

10. The method as in claim 1, further comprising:
    a planarization step following said filling with said conductive material, wherein said planarization step provides a conductive filled via that having an upper surface coplanar with an upper surface of said second dielectric material.

11. A method of fabricating a semiconductor structure comprising:
    providing an interconnect structure that includes a first dielectric layer having at least one conductive feature embedded therein, a second dielectric layer having at least one via opening that exposes a portion of said at least one conductive feature, said lower and upper interconnect levels are partially separated by a dielectric capping layer;
    forming a first barrier layer on sidewalls of said via opening;
    forming a conductive protrusion extending from said exposed portion and into said at least one via opening;
    forming a seed layer within said at least one via opening, and;
    filling said at least one via opening with a conductive material.

12. The method as in claim 11, wherein said providing said interconnect structure includes forming at least one conductive feature within said first dielectric material, forming a blanket dielectric capping layer on said first dielectric material, forming said second dielectric material on said blanket dielectric capping layer, forming a patterned hard mask having via patterns on said second dielectric material, and transferring said via patterns into said second dielectric material and said blanket dielectric capping layer.

13. The method as in claim 11, further comprising:
    a forming a barrier layer step after said forming a conductive protrusion step and before said forming a seed layer step, said forming a barrier layer step comprising forming a second barrier layer on said first barrier layer and atop said conductive protrusion.

14. The method as in claim 11, further comprises forming said first barrier layer with a material selected from a group consisting of Ta, TaN, Ti, TiN, Ru, RuN, RuTa, RuTaN, W, WN and Co.

15. The method as in claim 13, further comprises forming said second barrier layer with a material selected from a group consisting of Ta, TaN, Ti, TiN, Ru, RuN, RuTa, RuTaN, W, WN and Co.

16. The method as in claim 11, wherein said removing of said first barrier layer comprises sputtering directional gas selected from a group consisting of Ar, He, Ne, Xe, $N_2$, $H_2$, $NH_3$, $N_2H_2$ and mixtures thereof.

17. The method as in claim 11, further comprises forming said conductive protrusion with PVD, CVD, ALD, electro plating, electroless plating, or combinations thereof.

18. The method as in claim 11, further comprising said forming of said seed layer comprises depositing one or a combination of Ru, TaRu, Ir, Rh, Pt, Pd, Cu, Co or alloys thereof.

19. The method as in claim 11, further comprising said filling said at least one via opening comprises depositing at least one of Cu, Al, W or alloys thereof.

20. The method as in claim 11, further comprising:
- a planarization step following said filling with said conductive material, wherein said planarization step provides a conductive filled via that having an upper surface coplanar with an upper surface of said second dielectric material.

* * * * *